US006958112B2

(12) United States Patent
Karim et al.

(10) Patent No.: US 6,958,112 B2
(45) Date of Patent: Oct. 25, 2005

(54) METHODS AND SYSTEMS FOR HIGH-ASPECT-RATIO GAPFILL USING ATOMIC-OXYGEN GENERATION

(75) Inventors: M. Ziaul Karim, San Jose, CA (US); Farhad K. Moghadam, Saratoga, CA (US); Siamak Salimian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 10/446,531

(22) Filed: May 27, 2003

(65) Prior Publication Data

US 2004/0241342 A1 Dec. 2, 2004

(51) Int. Cl.[7] .................................................. C23C 14/34

(52) U.S. Cl. ................................. 204/192.3; 204/192.23

(58) Field of Search ......................... 204/192.23, 192.3; 427/585; 216/37

(56) References Cited

U.S. PATENT DOCUMENTS 4,572,841 A 2/1986 Kaganowicz et al. ....... 427/571
4,690,746 A 9/1987 McInerney et al. .... 204/192.32

(Continued)

FOREIGN PATENT DOCUMENTS

GB 2 267 291 A 12/1993 ........... C23C/16/30
JP 2-58836 A 2/1990 ....... H01L/21/3205
JP 7-161703 A 6/1995 ........... H01L/21/31

OTHER PUBLICATIONS

Abraham, "Reactive Facet Tapering of Plasma Oxide For Multilevel Interconnect Applications," VMIC Conference. pp. 115–121 (1987).

Lee et al., "Dielectric Planarization Techniques For Narrow Pitch Multilevel Interconnects," VMIC Conference, pp. 85–92 (1987).

(Continued)

*Primary Examiner*—Steven Versteeg
(74) *Attorney, Agent, or Firm*—Townsend and Townsend & Crew

(57) ABSTRACT

Methods and systems are provided for depositing silicon oxide in a gap on a substrate. The silicon oxide is formed by flowing a process gas into a process chamber and forming a plasma having an overall ion density of at least $10^{11}$ ions/cm$^3$. The process gas includes $H_2$, a silicon source, and an oxidizing gas reactant, and deposition into the gap is achieved using a process that has simultaneous deposition and sputtering components. The probability of forming a void is reduced by ensuring that the plasma has a greater density of ions having a single oxygen atom than a density of ions having more than one oxygen atom.

11 Claims, 10 Drawing Sheets

U.S. PATENT DOCUMENTS

| | | | | |
|---|---|---|---|---|
| 4,737,379 | A | 4/1988 | Hudgens et al. | 427/375 |
| 4,835,005 | A | 5/1989 | Hirooka et al. | 427/568 |
| 4,872,947 | A | 10/1989 | Wang et al. | 216/38 |
| 4,890,575 | A | 1/1990 | Ito et al. | 118/723 HC |
| 4,892,753 | A | 1/1990 | Wang et al. | 427/579 |
| 4,960,488 | A | 10/1990 | Law et al. | 438/694 |
| 5,000,113 | A | 3/1991 | Wang et al. | 118/723 E |
| 5,089,442 | A | 2/1992 | Olmer | 428/631 |
| 5,156,881 | A | 10/1992 | Okano et al. | 427/572 |
| 5,271,972 | A | 12/1993 | Kwok et al. | 428/579 |
| 5,275,977 | A | 1/1994 | Otsubo et al. | 438/695 |
| 5,279,865 | A | 1/1994 | Chebi et al. | 427/574 |
| 5,302,233 | A | 4/1994 | Kim et al. | 438/692 |
| 5,314,724 | A | 5/1994 | Tsukune et al. | 427/489 |
| 5,319,247 | A | 6/1994 | Matsuura | 257/760 |
| 5,362,526 | A | 11/1994 | Wang et al. | 427/573 |
| 5,416,048 | A | 5/1995 | Blalock et al. | 438/695 |
| 5,468,342 | A | 11/1995 | Nulty et al. | 438/714 |
| 5,507,881 | A | 4/1996 | Sichanugrist et al. | 136/252 |
| 5,525,550 | A | 6/1996 | Kato | 438/788 |
| 5,571,576 | A | 11/1996 | Qian et al. | 427/574 |
| 5,589,233 | A | 12/1996 | Law et al. | 427/579 |
| 5,593,741 | A | 1/1997 | Ikeda | 427/579 |
| 5,599,740 | A | 2/1997 | Jang et al. | 438/626 |
| 5,614,055 | A | 3/1997 | Fairbairn et al. | 156/345.33 |
| 5,621,241 | A | 4/1997 | Jain | 257/632 |
| 5,624,582 | A | 4/1997 | Cain | 438/715 |
| 5,629,043 | A | 5/1997 | Inaba et al. | 427/79 |
| 5,645,645 | A | 7/1997 | Zhang et al. | 118/723 MW |
| 5,679,606 | A | 10/1997 | Wang et al. | 438/763 |
| 5,712,185 | A | 1/1998 | Tsai et al. | 438/424 |
| 5,719,085 | A | 2/1998 | Moon et al. | 438/424 |
| 5,776,557 | A | 7/1998 | Okano et al. | 427/579 |
| 5,786,039 | A | 7/1998 | Brouquet | 427/578 |
| 5,804,259 | A | 9/1998 | Robles | 427/577 |
| 5,807,785 | A | 9/1998 | Ravi | 438/624 |
| 5,849,455 | A | 12/1998 | Ueda et al. | 430/128 |
| 5,850,105 | A | 12/1998 | Dawson et al. | 257/758 |
| 5,858,876 | A | 1/1999 | Chew | 438/695 |
| 5,869,149 | A | 2/1999 | Denison et al. | 427/579 |
| 5,872,052 | A | 2/1999 | Iyer | 438/622 |
| 5,872,058 | A | 2/1999 | Van Cleemput et al. | 428/692 |
| 5,874,350 | A | 2/1999 | Nakagawa | 438/485 |
| 5,903,106 | A | 5/1999 | Young et al. | 315/111.41 |
| 5,910,342 | A | 6/1999 | Hirooka et al. | 427/573 |
| 5,913,140 | A | 6/1999 | Roche et al. | 438/624 |
| 5,915,190 | A | 6/1999 | Pirkle | 438/424 |
| 5,937,323 | A | 8/1999 | Orczyk et al. | 438/624 |
| 5,953,635 | A | 9/1999 | Andideh | 438/761 |
| 5,968,610 | A | 10/1999 | Liu et al. | 427/579 |
| 5,976,327 | A | 11/1999 | Tanaka | 204/192.15 |
| 5,990,000 | A | 11/1999 | Hong et al. | 438/631 |
| 5,990,013 | A | 11/1999 | Berenguer et al. | 438/706 |
| 6,013,191 | A | 1/2000 | Nasser-Faili et al. | 296/67 |
| 6,013,584 | A | 1/2000 | M'Saad | 438/783 |
| 6,030,666 | A | 2/2000 | Lam et al. | 427/539 |
| 6,030,881 | A | 2/2000 | Papasouliotis et al. | 438/424 |
| 6,037,018 | A | 3/2000 | Jang et al. | 427/579 |
| 6,039,851 | A | 3/2000 | Iyer | 204/192.32 |
| 6,042,901 | A | 3/2000 | Denison et al. | 427/579 |
| 6,059,643 | A | 5/2000 | Hu et al. | 451/296 |
| 6,070,551 | A | 6/2000 | Li et al. | 118/723.3 |
| 6,071,573 | A | 6/2000 | Koemtzopoulos et al. | 427/578 |
| 6,074,959 | A | 6/2000 | Wang et al. | 438/738 |
| 6,077,786 | A | 6/2000 | Chakravarti et al. | 438/695 |
| 6,096,646 | A | 8/2000 | Lee et al. | 438/680 |
| 6,106,678 | A | 8/2000 | Shufflebotham et al. | 204/192.32 |
| 6,136,685 | A | 10/2000 | Narwankar et al. | 438/624 |
| 6,147,009 | A | 11/2000 | Grill et al. | 438/780 |
| 6,149,976 | A | 11/2000 | Matsuki et al. | 427/255.37 |
| 6,149,986 | A | 11/2000 | Shibata et al. | 427/571 |
| 6,167,834 | B1 | 1/2001 | Wang et al. | 118/723 E |
| 6,170,428 | B1 | 1/2001 | Redeker et al. | 118/723.7 |
| 6,174,808 | B1 | 1/2001 | Jang et al. | 438/680 |
| 6,182,602 | B1 | 2/2001 | Redeker et al. | 118/723 R |
| 6,184,158 | B1 | 2/2001 | Shufflebotham et al. | 438/782 |
| 6,189,483 | B1 | 2/2001 | Ishikawa et al. | 118/723 E |
| 6,190,233 | B1 | 2/2001 | Hong et al. | 451/2 |
| 6,191,026 | B1 | 2/2001 | Rana et al. | 438/624 |
| 6,194,037 | B1 | 2/2001 | Terasaki et al. | 427/569 |
| 6,194,038 | B1 | 2/2001 | Rossman | 427/569 |
| 6,197,705 | B1 | 3/2001 | Vassiliev | 438/789 |
| 6,200,412 | B1 | 3/2001 | Kilgore et al. | 156/345.28 |
| 6,203,863 | B1 | 3/2001 | Liu et al. | 427/579 |
| 6,217,658 | B1 | 4/2001 | Orczyk et al. | 118/697 |
| 6,224,950 | B1 | 5/2001 | Hirata | 427/535 |
| 6,228,751 | B1 | 5/2001 | Yamazaki et al. | 438/585 |
| 6,230,650 | B1 | 5/2001 | Yamazaki | 118/723 ME |
| 6,232,196 | B1 | 5/2001 | Raaijmakers et al. | 438/386 |
| 6,313,010 | B1 | 11/2001 | Nag et al. | 438/435 |
| 6,326,064 | B1 | 12/2001 | Denison et al. | 427/571 |
| 6,335,288 | B1 | 1/2002 | Kwan et al. | 438/694 |
| 6,346,302 | B2 | 2/2002 | Kishimoto et al. | 427/569 |
| 6,372,291 | B1 | 4/2002 | Hua et al. | 427/255.28 |
| 6,376,391 | B1 * | 4/2002 | Olson et al. | 438/758 |
| 6,395,150 | B1 | 5/2002 | Van Cleemput et al. | 204/192.37 |
| 6,413,886 | B1 * | 7/2002 | Kersch et al. | 438/788 |
| 6,416,823 | B2 | 7/2002 | Li et al. | 427/569 |
| 6,465,044 | B1 | 10/2002 | Jain et al. | 427/255.37 |
| 6,503,843 | B1 | 1/2003 | Xia et al. | 438/706 |
| 6,531,193 | B2 | 3/2003 | Fonash et al. | 427/579 |
| 6,537,929 | B1 | 3/2003 | Cheung et al. | 438/790 |
| 6,559,026 | B1 | 5/2003 | Rossman et al. | 428/424 |
| 6,589,610 | B2 | 7/2003 | Li et al. | 427/569 |
| 6,589,611 | B1 | 7/2003 | Li et al. | 427/579 |
| 6,596,653 | B2 | 7/2003 | Tan et al. | 438/788 |
| 6,596,654 | B1 | 7/2003 | Bayman et al. | 438/788 |
| 6,607,983 | B1 | 8/2003 | Chun et al. | 438/691 |
| 6,626,188 | B2 | 9/2003 | Fitzsimmons et al. | 134/1.1 |
| 6,653,203 | B1 | 11/2003 | Huang et al. | 438/435 |
| 6,673,722 | B1 | 1/2004 | Yamazaki | 438/728 |
| 6,713,390 | B2 | 3/2004 | M'Saad et al. | 438/680 |
| 2001/0028924 | A1 | 10/2001 | Sherman | 427/255.28 |
| 2001/0033900 | A1 | 10/2001 | M'Saad et al. | 427/569 |
| 2002/0192396 | A1 | 12/2002 | Wang et al. | 427/574 |
| 2003/0056900 | A1 | 3/2003 | Li et al. | 156/345.33 |
| 2003/0159656 | A1 | 8/2003 | Tan et al. | 118/723 E |
| 2003/0203637 | A1 | 10/2003 | Hua et al. | 438/694 |
| 2003/0219540 | A1 | 11/2003 | Law et al. | 427/376.2 |
| 2004/0146661 | A1 | 7/2004 | Kapoor et al. | 427/569 |

OTHER PUBLICATIONS

Meeks et al., "Modeling of $SiO_2$ deposition in high density plasma reactors and comparisons of model predictions with experimental measurements," *J. Vac. Sci. Technol. A.* 16(2):544–563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510–512, held in Japan, (1993).

Nalwa, H.S., *Handbook of Low and High Dielectric Constant Materials and Their Applications*, vol. 1, p. 66 (1999).

Nguyen, s.v., "High–Density Plasma Chemical Vapor Deposition of Silicon–Based Dielectric Films for Integrated Circuits," *Journal of Research and Development*, vol. 43, ½(1999).

Qian et al., "High Density Plasma Deposition and Deep Submicron Gap Fill with Low Dielectric Constant SiOF Films," DUMIC Conference, pp. 50–56, held in California (1995).
Vassiliev et al., "Trends in Void–Free Pre–Metal CVD Dielectrics," *Solid State Technology*, pp. 129–136 (Mar. 2001).
U.S. Appl. No. 09/854,083.
Alonso, J.C. et al., "High rate–low temperature deposition of silicon dioxide films . . . " JVST A 13(6) Nov./Dec. 1995, pp. 2924–2929.
Bar–Ilan et al., "A comparative study of sub–micron gap filling and planarization techniques", SPIE vol. 2636, Oct. 1995, . 277–288.
Broomfield et al., "HDP Dielectric BEOL Gapfill: A Process for Manufacturing", IEEE/SEMI Advanced Semiconductor Manufacturing Conference 1996, pp. 255–258.
Conti et al., "Processing methods to fill High aspect ratio gaps without premature constriction," DUMIC Conference, Feb. 8–9, 1999, pp. 201–209.
Horiike et al., "High rate and highly selective Si02 etching employing inductively coupled plasma and discussion on reaction kinetics", JVST A 13(3) May./Jun. 1995, pp. 801–809.
Kuo et al., "Thick SiO2 films obtained by plasma–enhanced chemical vapor deposition using hexamethyldisilazane, Carbon dioxide and hydrogen", Journal of The Electrochemical Society, 147 (7) 2000 p. 2679–2684.
Lee et al., "Low Temperature Silicon Nitride and silicon Dioxide Film . . . " JECS; 147 (4) 2000, pp. 1481–1486.
Lim et al., "Gap–fill Performance and Film properties of PMD Films for the 65 nm device Technology", IEEE International Symposium on Semiconductor Manufacturing, Sep. 30–Oct. 2, 2003, p. 435–438.
Nag et al., "Comparative Evaluation of gap–fill dielectrics in shallow trench isolation for sub–0.25 micron Technologies" IEDM 1996, . 841–844.
Pai, "High quality voids free oxide deposition", Materials Chemistry and Physics, 44, 1996, pp. 1–8.
Pankov et al., "The effect of hydrogen addition on the fluorine doping level of SiO2 films prepared by remote plasma enhanced chemical vapor deposition using SiF4–based plasmas", Japanese Journal of Applied Physics part 1,37 (11) Nov. 1998, pp. 6135–6141.
Peters, "Choices and challenges for shallow trench isolation", Semiconductor International, Apr. 1999, pp. 69–76.
Takahashi et al., "The Effect of Gas–phase additives C2H4, C2H6 and C2H2 on SiH4/O2 chemical vapor deposition". Journal of the Electrochemical Society, 143 (4) Apr. 1996, pp. 1355–1361.
Takeishi et al., "Fluorocarbon films deposited by PECVD with . . . " DUMIC 1996, pp. 71–77.
Vassiliev et al., "Properties and Gap–Fill Capability of HPD–CVD Phosphosilicate Glass Films for Subquarter–Micrometer ULSI Device Technology" Electrochemical and Solid–State Letters 3 (2), 2000, pp. 80–83.
Vassiliev, "Void–free pre–metal dielectric gap– fill capability with CVD films for subquarter–micron ULSI" DUMIC, Feb. 28–29, 2000, pp. 121–132.
Xia et al., "High aspect ratio trench filing sing two–step . . . " JECS, 146 (5),1999, p. 1884–1888.
Xia et al., "High Temperature Subatmospheric Chemical Vapor Deposited Undoped Silicate Glass," JECS 146 (3) 1999, pp. 1181–1185.
Yota et al., "Advanced passivation layer using high–density plasma CVD oxide for 0.25 micron CMOS Technology" DUMIC, Feb. 16–17, 1998,pp. 185–192.
Yota et al., "Extendibility of ICP high–density plasma CVD for use as intermetal dielectric and passivation layers for 0.18 micron technology," DUMIC Feb. 8–9, 1999, pp. 71–82.

* cited by examiner

METHODS AND SYSTEMS FOR HIGH-ASPECT-RATIO GAPFILL USING ATOMIC-OXYGEN GENERATION

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

HDP-CVD systems form a plasma that is at least approximately two orders of magnitude greater than the density of a standard, capacitively coupled plasma CVD system. Examples of HDP-CVD systems include inductively coupled plasma systems and electron cyclotron resonance (ECR) plasma systems, among others. HDP-CVD systems generally operate at lower pressure ranges than low-density plasma systems. The low chamber pressure employed in HDP-CVD systems provides active species having a long mean-free-path and reduced angular distribution. These factors, in combination with the plasma density, contribute to a significant number of constituents from the plasma reaching even the deepest portions of closely spaced gaps, providing a film with improved gapfill capabilities compared with films deposited in a low-density plasma CVD system.

Another factor that allows films deposited by HDP-CVD techniques to have improved gapfill characteristics is the promotion of sputtering by the high density of the plasma, simultaneous with film deposition. The sputtering component of HDP deposition processes slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma towards the substrate. The electric field can be applied throughout the HDP deposition process for further promotion of sputtering and to provide better gapfill characteristics for a given film.

It was initially thought that because of their simultaneous deposition/sputter nature, HDP-CVD processes could fill the gaps or trenches that were created in almost any application. Semiconductor manufacturers have discovered, however, that there is a practical limit to the aspect ratio of gaps that HDP-CVD processes are able to fill. For example, one HDP-CVD process commonly used to deposit a silicon oxide gapfill film forms a plasma from a process gas that includes silane $SiH_4$, molecular oxygen $O_2$, and argon Ar. It has been reported that when such a process is used to fill certain narrow-width high-aspect-ratio gaps, the sputtering caused by argon in the process gas may hamper the gapfill efforts. Specifically, it has been reported that material sputtered by argon in the process redeposits on the upper portions of the sidewalls of the gaps being filled at a rate faster than at the lower portions. This, in turn, may result in the formation of a void in the gap if the upper areas of regrowth join before the gap is completely filled.

FIG. 1 provides schematic cross-sectional views of a silicon oxide film at different stages of deposition to illustrate the potential gapfill limitation associated with some CVD processes. The gapfill problem is illustrated in somewhat exaggerated form to illustrate the problem better. The top portion of FIG. 1 shows the initial structure 104 in which a gap 120 is defined by two adjacent features 124 and 128 having horizontal surfaces 122, with the horizontal surface at the bottom of the gap being denoted 132. As shown in structure 108, i.e. the second portion of the figure from the top, a conventional HDP-CVD silicon oxide deposition process results in direct deposition on the horizontal surface 132 at the bottom of the gap 120 and on the horizontal surfaces 122 above the features 124 and 128. It also, however, results in indirect deposition (referred to as "redeposition") on the sidewalls 140 of the gap 120 due to recombination of material sputtered from the silicon oxide film as it grows. In certain small-width, high-aspect-ratio applications, the continued growth of the silicon oxide film results in formations 136 on the upper section of the sidewall 140 that grow towards each other at a rate of growth exceeding the rate at which the film grows laterally on the lower portions of the sidewall. This trend is shown in structures 108 and 112, with the final result in structure 116 being the formation of a void 144 within the film. The probability of forming a void is very directly related to the rate and character of the redeposition.

A variety of techniques have been developed to extend the gapfill capabilities of silicon oxide HDP-CVD processes. Two specific examples include U.S. Pat. No. 5,872,058 ("the '058 patent") and U.S. Pat. No. 6,395,150 ("the '150 patent). The '058 patent discloses that the gapfill capabilities of a silicon oxide film may be extended by reducing the amount of argon or other inert components in the HDP process. This is intended to reduce the amount of sputter and thereby reduce the rate of redeposition. The '150 patent discloses that if argon, which is a diluent gas in addition to a sputtering agent, is eliminated from the process gas as suggested in the '058 patent, deposition rate uniformity may suffer. The '150 patent then teaches that this problem may be overcome by substituting a flow of argon with a flow of helium.

BRIEF SUMMARY OF THE INVENTION

Embodiments of the invention thus provide a method for depositing silicon within a gap on a substrate that produces improved redeposition characteristics. The inventors have identified that in addition to Ar, a further significant source of redeposition is the presence of molecular-oxygen ions in the plasma of a $SiH_4$+$O_2$ HDP-CVD process, even while they provide the source of oxidation as an oxidizing gas reactant. Accordingly, the effect of such molecular-oxygen ions is reduced in embodiments of the invention by maintaining certain ionic-species distributions in the plasma. In particular, the plasma is constrained by the process conditions to have a greater density of ions having a single oxygen atom than a density of ions having more than one oxygen atom.

In a specific set of embodiments, silicon oxide is deposited on a substrate in a process chamber. The silicon oxide is formed by flowing a process gas into the process chamber and forming a high-density plasma, i.e. a plasma having an overall ion density of at least $10^{11}$ ions/$cm^3$. The process gas includes $H_2$, a silicon source, and an oxidizing gas reactant, and deposition into a gap having an aspect ratio of at least 4:1 is achieved using a process that has simultaneous deposition and sputtering components. The probability of forming a void is reduced by ensuring that the plasma has a greater density of ions having a single oxygen atom than a density of ions having more than one oxygen atom.

There are various specific characteristics of the plasma in specific embodiments, which may be achieved in part by the use of specific oxidizing gas reactants. In some embodiments, the ions having a single oxygen atom comprise hydroxyl radicals. In other embodiments, they may comprise atomic-oxygen atoms. The oxidizing gas reactants may include, for example, $O_3$, $H_2O_2$, $H_2O$, $N_2O$, and NO, among others. In one specific embodiment, the oxidizing gas reactant comprises remotely generated atomic oxygen.

The flow of $H_2$ acts to reduce the sputtering of molecular-oxygen ions further by reducing the partial pressure of $O_2^+$. In some instances, this light fluent gas may be the dominant part of a premixture that includes another heavier inert gas in a small concentration, such as He or another inert gas. The relative flows of the $H_2$ and heavier inert gas may vary over time. In one embodiment, $H_2$ is flowed with a rate of at least 300 sccm.

For particularly aggressive gapfill applications, the deposition with a plasma having these ionic species characteristics may form part of a dep/etch/dep process. Such a dep/etch/dep process includes at least two deposition steps separated by an etching step, and may include multiple such cyclings. Depending on the particular application, the deposition step that has the greater density of single-oxygen-atom ions may be the initial deposition, the final deposition, or some other intermediate deposition. In a particular embodiment, every deposition step of the dep/etch/dep process has a greater density of single-oxygen-atom ions than of ions having more than one oxygen atom.

The methods of the present invention may be embodied in a computer-readable storage medium having a computer-readable program embodied therein for directing operation of a substrate processing system. Such a system may include a process chamber, a substrate holder, a pressure-control system, and a gas-delivery system. The computer-readable program includes instructions for operating the substrate processing system to deposit a film in accordance with the embodiments of the present invention.

A further understanding of the nature and advantages of the present invention may be realized by reference to the remaining portions of the specification and the drawings.

DETAILED DESCRIPTION OF THE INVENTION

Figure 1:
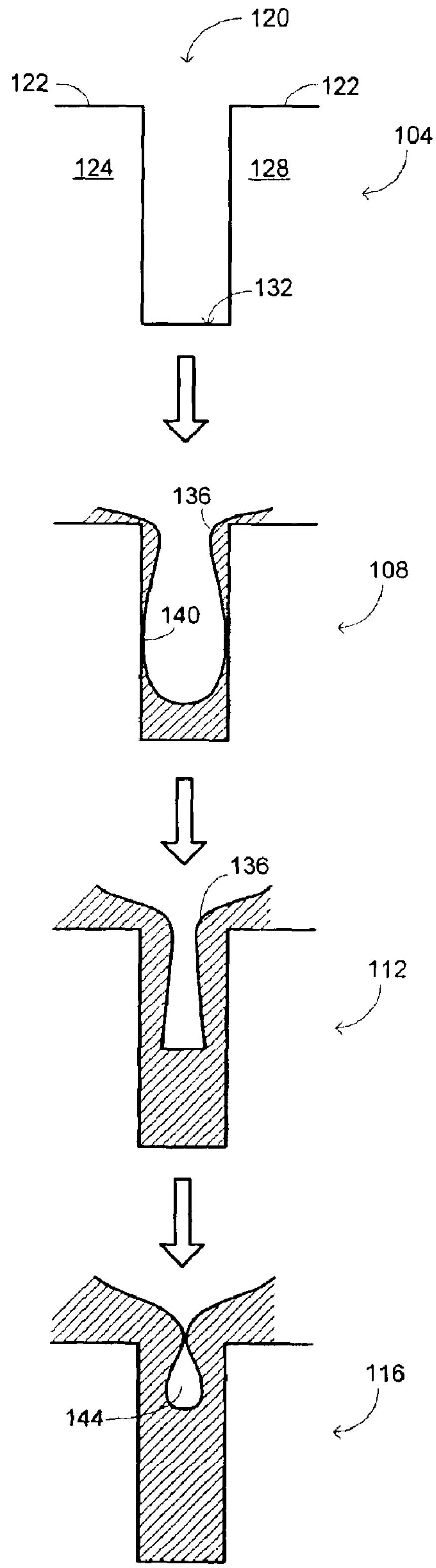
FIG. 1 provides schematic cross-sectional drawings illustrating the formation of a void during a prior-art gapfill process.

Embodiments of the invention are directed to a method of depositing a silicon oxide layer to fill a gap in a surface of a substrate using a high-density-plasma CVD process. Silicon oxide films deposited according to the techniques of the invention have excellent gapfill capabilities and are able to fill high-aspect-ratio gaps encountered in, for example, shallow-trench-isolation ("STI") structures. Films deposited by the method of the invention are suitable for use in the fabrication of a variety of integrated circuits, and are particularly useful in the fabrication of integrated circuits having minimum feature sizes of 0.10 $\mu$m or less.

As used herein, a high-density-plasma process is a plasma CVD process that includes simultaneous deposition and sputtering components and that employs a plasma having an ion density on the order of $10^{11}$ ions/$cm^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{(\text{net deposition rate}) + (\text{blanket sputtering rate})}{(\text{blanket sputtering rate})}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxidizing gas reactant. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, or even a flow a heavier inert gas, such as Ne, Ar, or Xe. The level of sputtering provided by the different fluent gases is inversely related to their atomic mass (or molecular mass in the case of $H_2$), with $H_2$ producing even less sputtering than He. In some embodiments of the invention discussed in greater detail below, the sputtering agent is provided with a premixture of at least two of these gases.

The inventors have discovered that while the reduction in redeposition that may be achieved by using He or $H_2$ as a fluent gas is significant, there remains a substantial redeposition component in processes that use $O_2$ as an oxidizing gas reactant. While the deposition chemistry is relatively complex, $O_2$ has sufficient binding strength that the oxygen components of the high-density plasma are dominated by $O_2^+$ ions. These ions have a relatively large atomic mass and therefore continue to provide substantial sputtering that is manifested by redeposition and cusping. Accordingly, embodiments of the invention provide HDP-CVD process conditions in which the $O_2^+$ component of the high-density plasma is instead dominated by $RO^+$ ions, usually $O^+$ or $OH^+$ ions. The $RO^+$ ions have about half the molecular mass of $O_2^+$ ions when R=1 or H, and therefore provide less sputtering. Reference to plasmas having a greater density of $RO^+$ ions than $O_2^+$ ions is intended to include the circumstance where the plasma has no $O_2^+$ ions, but has a nonzero density of $RO^+$ ions.

Figure 2:
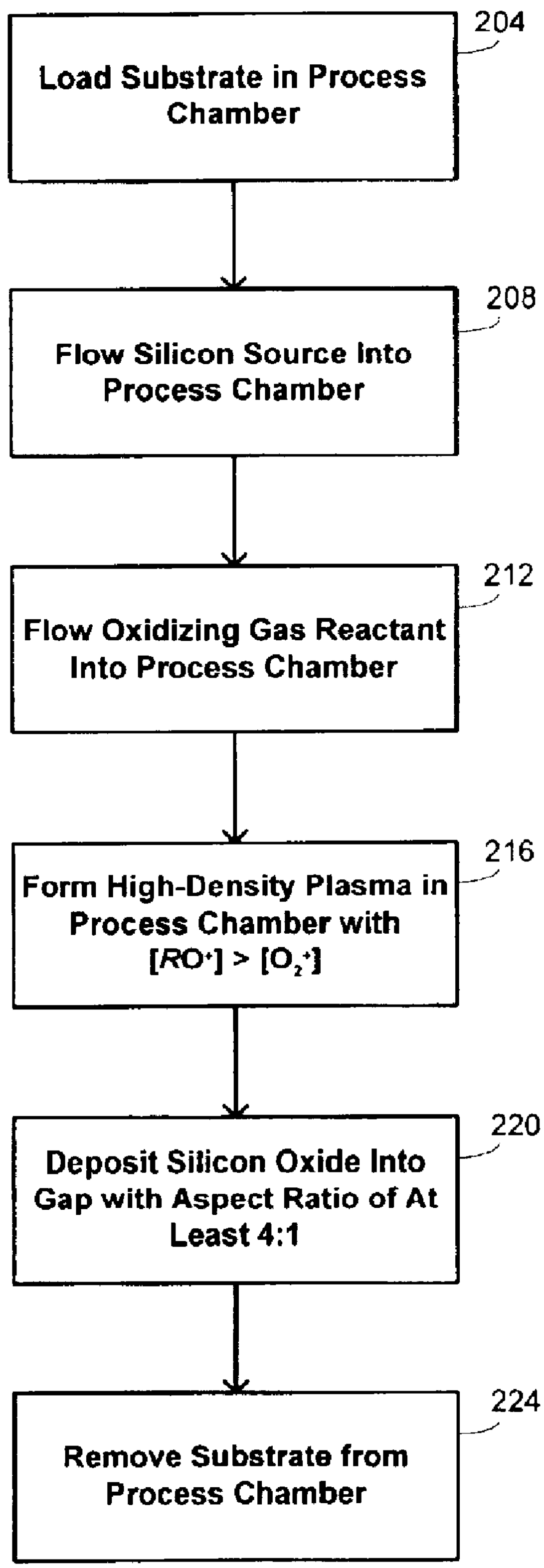
FIG. 2 is a flow diagram illustrating a method for depositing a film to fill a gap in one embodiment of the invention.
Figure 3:
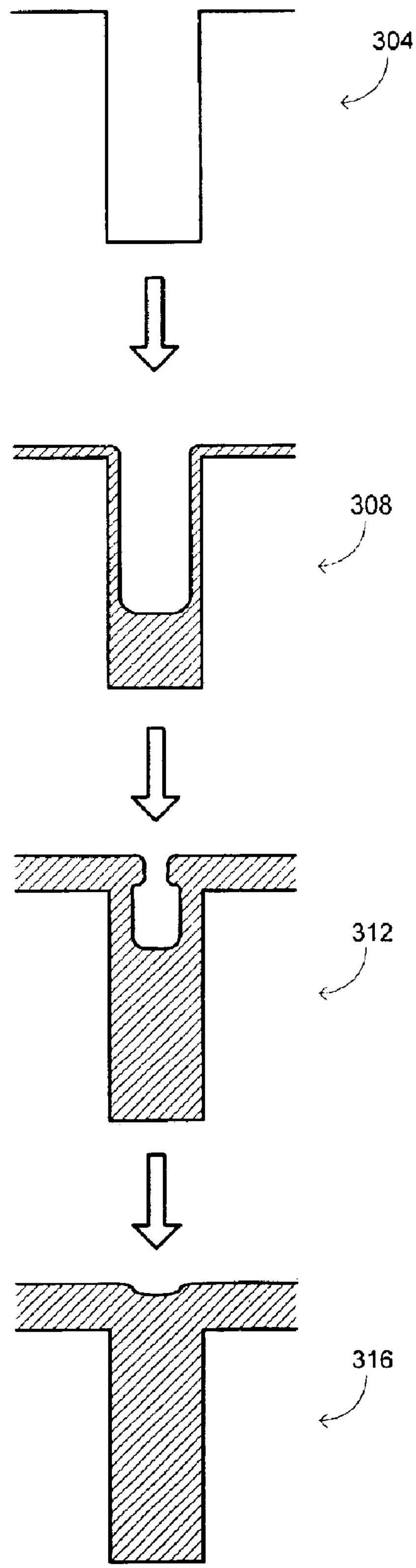
FIG. 3 provides schematic cross-sectional drawings illustrating how a high-aspect-ratio feature may be filled according to the embodiment illustrated in FIG. 2.

In order to better understand the invention, reference is made to FIGS. 2 and 3, which respectively provide a flow diagram that illustrates an embodiment and a series of schematic cross-sectional views of a substrate as material is deposited. The process is discussed explicitly with respect to deposition of an undoped silicon oxide film that may be used, for example, in an STI application. It is to be understood, however, that the techniques described are also applicable to other applications, such as intermetal dielectric ("IMD") layers and premetal dielectric ("PMD") layers, among others. Also, the techniques are applicable to the deposition of a variety of materials using HDP-CVD techniques. These materials, the use of which is application-dependent, include phosphorous silica glass, boron-doped silicate glass, borophosphosilicate glass, carbon-doped silica glass SiOC, and silicon oxynitride, among others.

As shown in FIG. 2, the process starts by loading a substrate into a process chamber at block 204. The substrate has one or more gaps formed between adjacent raised features, as shown with initial structure 304 in FIG. 3. The raised features may be, for example, adjacent metal lines, transistor gates, or other features. In some applications, the gap has an aspect ratio of at least 4:1. Once the substrate is properly positioned, a silicon source is flowed into the process chamber at block 208 and an oxidizing gas reactant is flowed into the process chamber at block 212. A high-density plasma is formed in the process chamber at block 216 with an ion density of $RO^+$ ions exceeding an ion density of $O_2^+$ ions. While the $RO^+$ ions usually comprise either $O^+$ ions and/or $OH^+$ ions, they may more generally comprise any ions that have a single oxygen atom.

The relative dominance of $RO^+$ ions over molecular-oxygen ions may be achieved in different ways in different embodiments. In some embodiments, it is achieved by flowing an oxidizing gas reactant that dissociates more predominantly into $RO^+$ components. Suitable oxidizing gas reactants include ozone $O_3$, hydrogen peroxide $H_2O_2$, and steam $H_2O$. The greater production of $O^+$ ions may be understood from a comparison of the relevant ionization and dissociation energies of $O_2$ with other oxidizing gas reactants:

$$O_2+e^- \rightarrow O^+ + O^+ + 3e^- \quad \Delta H = 5.164\ eV$$

$$H_2O+e^- \rightarrow OH^+ + H^+ + 3e^- \quad \Delta H = 5.167\ eV$$

$$H_2O_2+e^- \rightarrow OH^+ + OH^+ + 3e^- \quad \Delta H = 2.182\ eV$$

As seen from these results, the use of the identified alternative oxidizing gas reactants generally requires less energy for the production of $RO^+$ ions than for $O_2^+$ ions, making them more prevalent in the plasma than molecular-oxygen ions. The lowest-energy pathways for $H_2O$ and $H_2O_2$ provide pathways for the formation of hydroxyl radicals $OH^+$, which may act both as sputtering agents and as oxidizing agents. Hydroxyl-radical-assisted oxidation of silicon on the surface of the forming film provides enhanced surface mobility when compared with oxidation by atomic-oxygen ions, so that the use of either $H_2O$ or $H_2O_2$ as an oxidizing gas reactant provides improved bottom-up gapfill, even though the dissociation energy of $H_2O$ is comparable to the dissociation energy of $O_2$. When $O_3$ is used as an oxidizing gas reactant, the improved bottom-up character of the gapfill deposition is achieved from a greater prevalence of $O^+$ ions than $O_2^+$ ions. Alternative oxidizing gas reactants that preferentially provide $O^+$ ions in the plasma include NO and $N_2O$, among others. Reflow or surface mobility may also be increased by selecting a suitable silicon source, which may include $SiH_4$, $SiF_4$, $Si_2H_6$, tetraethylorthosilicate ("TEOS"), tetramethylcyclotetrasiloxane ("TMCTS"), octamethylcyclotetrasiloxane ("OMCTS"), methyl silane, dimethyldimethoxysilane ("DMDMOS"), tetramethyldisiloxane ("TMDSO"), among others.

In other embodiments, dominance of the plasma by $O^+$ (R=1) ions is ensured by supplying atomic oxygen directly.

This atomic oxygen is produced in a remote plasma system ("RPS") or in a downstream plasma reactor, and introduced in the HDP process to reduce sputtering. In one embodiment, atomic oxygen is generated in the RPS plasma at a higher pressure than is used in the HDP process chamber, and it is subsequently flowed to the HDP process chamber with the silicon source to deposit the silicon oxide film. With the dominance of atomic oxygen in the plasma provided in this alternative fashion, the sputtering is also reduced in comparison with the use of $O_2$ as an oxidizing gas reactant.

The $RO^+$-dominated plasma is used to deposit silicon oxide in the gap at block 220. In some embodiments, the D/S ratio of the process is set to be between 4 and 20, which in combination with the dominance by $RO^+$ ions, helps to ensure that a substantially bottom-up gapfill process is used without clipping corners of the features. The bottom-up gapfill is illustrated schematically with the sequence of structures 308, 312, and 316 in FIG. 3, which shows that such bottom-up gapfill produces a film without the formation of a void. In this progression, there may still be some, much reduced, level of redeposition, as shown schematically with structure 312. After the gap has been filled, the substrate is removed from the process chamber at block 224. In cases of very aggressive gapfill applications, even this much reduced redeposition has the potential to cause sufficient breadloafing that there is a risk of void formation. Accordingly, the invention also encompasses additional embodiments that permit filling even more aggressive gaps.

Figure 4:
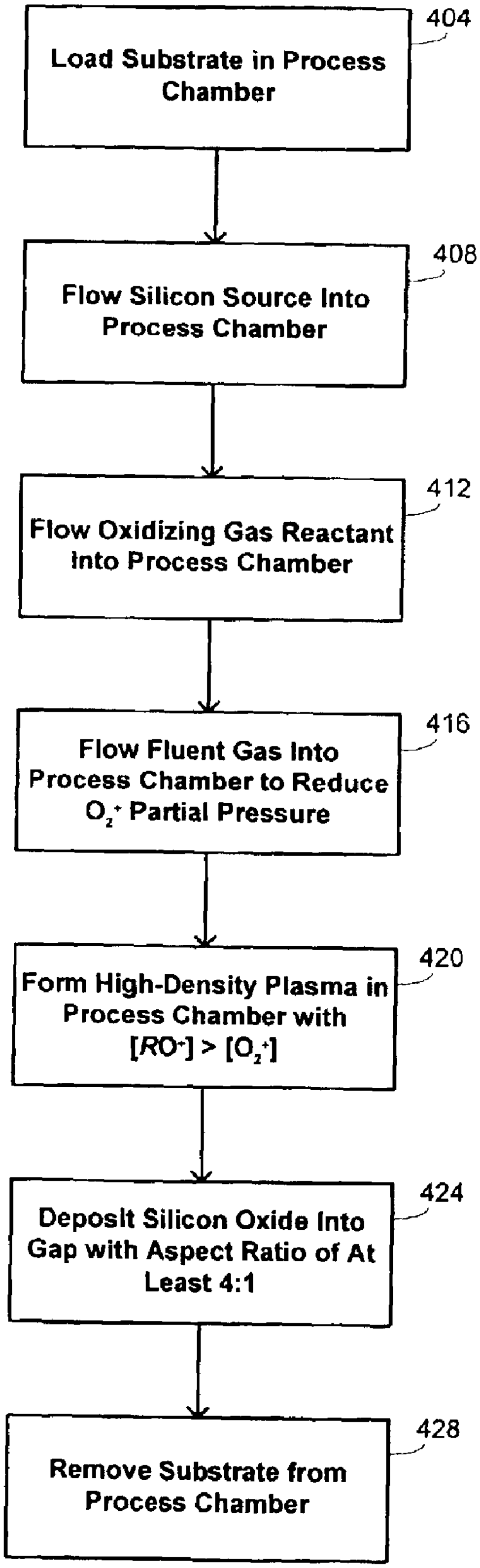
FIG. 4 provides a flow diagram illustrating a method for depositing a film to fill a gap in another embodiment of the invention.

In some such embodiments, illustrated with the flow diagram in FIG. 4, the process may be modified to include a flow of a fluent gas selected to reduce the partial pressure of $O_2^+$ ions that are present in the plasma. The combination of such a reduction in partial pressure with the dominance of $RO^+$ ions in the plasma may further enhance the bottom-up nature of the gapfill with an even greater decrease in the amount of redeposition. Similar to the embodiment described in connection with FIG. 2, the process begins by loading the substrate in the process chamber at block 404, and flowing a silicon source and an oxidizing gas reactant into the process chamber respectively at blocks 408 and 412. The silicon source and oxidizing gas reactant may be the same as previously described. The fluent gas is flowed at block 416 and is generally chosen to be a light gas, such as by having the fluent gas comprise $H_2$. In some embodiments a premixture of a plurality of gases may be used, such as a $H_2$/He mixture. In particular, the reduction in $O_2^+$ partial pressure resulting from the light fluent gas further reduces the sputtering effect of any $O_2^+$ ions that may be present, depending on the specific oxidizing gas reactant used and the available reaction pathways. It is noted, however, that it is undesirable as part of an HDP-CVD process to eliminate the sputtering effect. In this respect, embodiments of the invention differ significantly from thermal CVD processes such as SACVD or LPCVD, which are instead concerned with providing gas flows that ensure relatively rapid reactions. At block 420, a high-density plasma is formed with a greater ionic concentration of $RO^+$ than of $O_2^+$ so that the silicon oxide may be deposited in the gap at block 424 with a process having simultaneous deposition and sputtering components before removal of the substrate at block 428.

The use of molecular hydrogen $H_2$ as a fluent gas is described in copending, commonly assigned U.S. Pat. No. 6,808,748, entitied "HYDROGEN ASSISTED HDP-CVD DEPOSITION PROCESS FOR AGGRESSIVE GAP-FILL TECHNOLOGY," filed Jan. 23, 2003 by Bikram Kapoor et al., the entire disclosure of which is herein incorporated by reference for all purposes. In copending, commonly assigned U.S. Pat. No. 6,812,153, entitled "METHOD FOR HIGH ASPECT RATIO HDP CVD GAPFILL," filed Apr. 30, 2002 by Zhong Qiang Hua et al., the entire disclosure of which is herein incorporated by reference, the improvements in gapfill that may be achieved through a reduction in $O_2^+$ partial pressure were described, but were limited to situations in which the oxidizing gas reactant and applicable reaction pathways resulted in a dominance of $O_2^+$ ions in the plasma. Furthermore, that application was directed towards the use of He as a fluent gas. The inventors have now made the unexpected discovery that the effects of reducing the ionic concentration of $O_2^+$ ions and the effects of reducing the partial pressure of $O_2^+$ ions through use of fluent gas comprising $H_2$ combine synergistically to permit filling of very aggressive gaps. In one embodiment, $H_2$ is provided as a fluent gas at a rate of 300 sccm or greater.

In some instances, it is beneficial for the fluent gas to comprise a mixture that includes $H_2$ with a heavier inert gas. For example, in some embodiments, the fluent gas may comprise a premixture of $H_2$ with He or Ar. Inclusion of the heavier inert gas provides better deposition uniformity than the use of $H_2$ alone and may permit a significant cost saving because of the relatively high cost of $H_2$ sources compared with sources of other inert gases. These benefits are realized even where the amount of $H_2$ used in the premixture is significantly greater than the amount of the other inert gas. For example, in one embodiment, the premixture comprises greater than 95 wt. % $H_2$ and in another embodiment comprises greater than 99 wt. % $H_2$.

In other embodiments, aggressive gaps may be filled by integrating the $RO^+$-dominant process within a deposition/etch/deposition process ("dep/etch/dep") process. Such dep/etch/dep processes rely on a sequence of steps in which some material is initially deposited in the gap, with the deposition stopping before redeposition causes the breadloafing of material to form a void. This is followed by an etching step, in which the partially filled gap is reshaped, opening it so that more material can be deposited before it closes up and leaves an interior void. The reopened gap is then filled using a subsequent deposition step. Such cycling of deposition and etching steps was traditionally view by those of skill in the art as inutile the context of HDP-CVD processes because of its simultaneous deposition and sputtering components. Despite this view, it was demonstrated in U.S. Pat. No. 6,194,038, filed Mar. 20, 1998 by Kent Rossman that gapfill could be improved by using a dep/etch/dep process under certain HDP-CVD process conditions. The inventors have discovered that even more aggressive gaps may be filled by integrating the $RO^+$-dominant HDP-CVD process into such an HDP-CVD dep/etch/dep process.

Figure 5A:
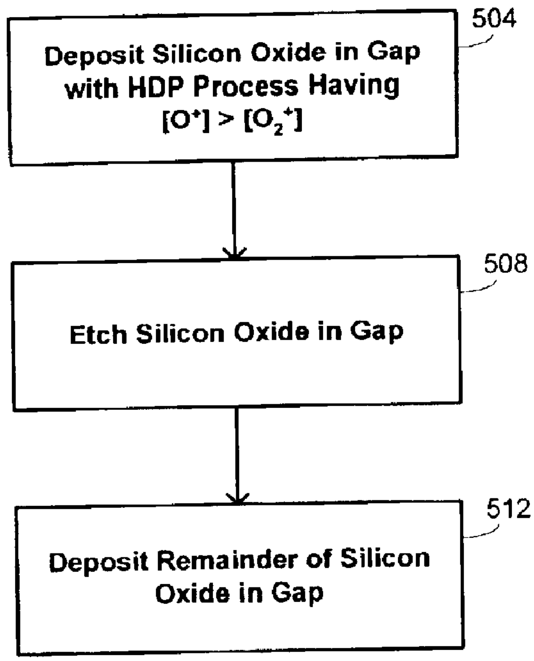
FIGS. 5A and 5B provide flow diagrams illustrating the use of a dep/etch/dep method for depositing a film to fill a gap in further embodiments of the invention.
Figure 5B:
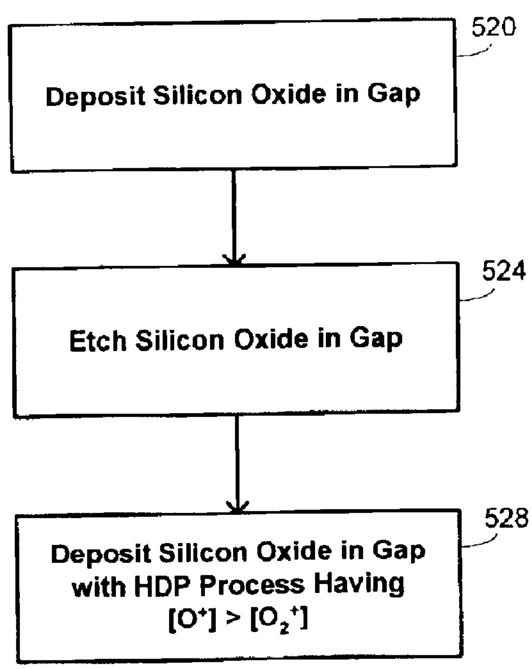
Figure 6:
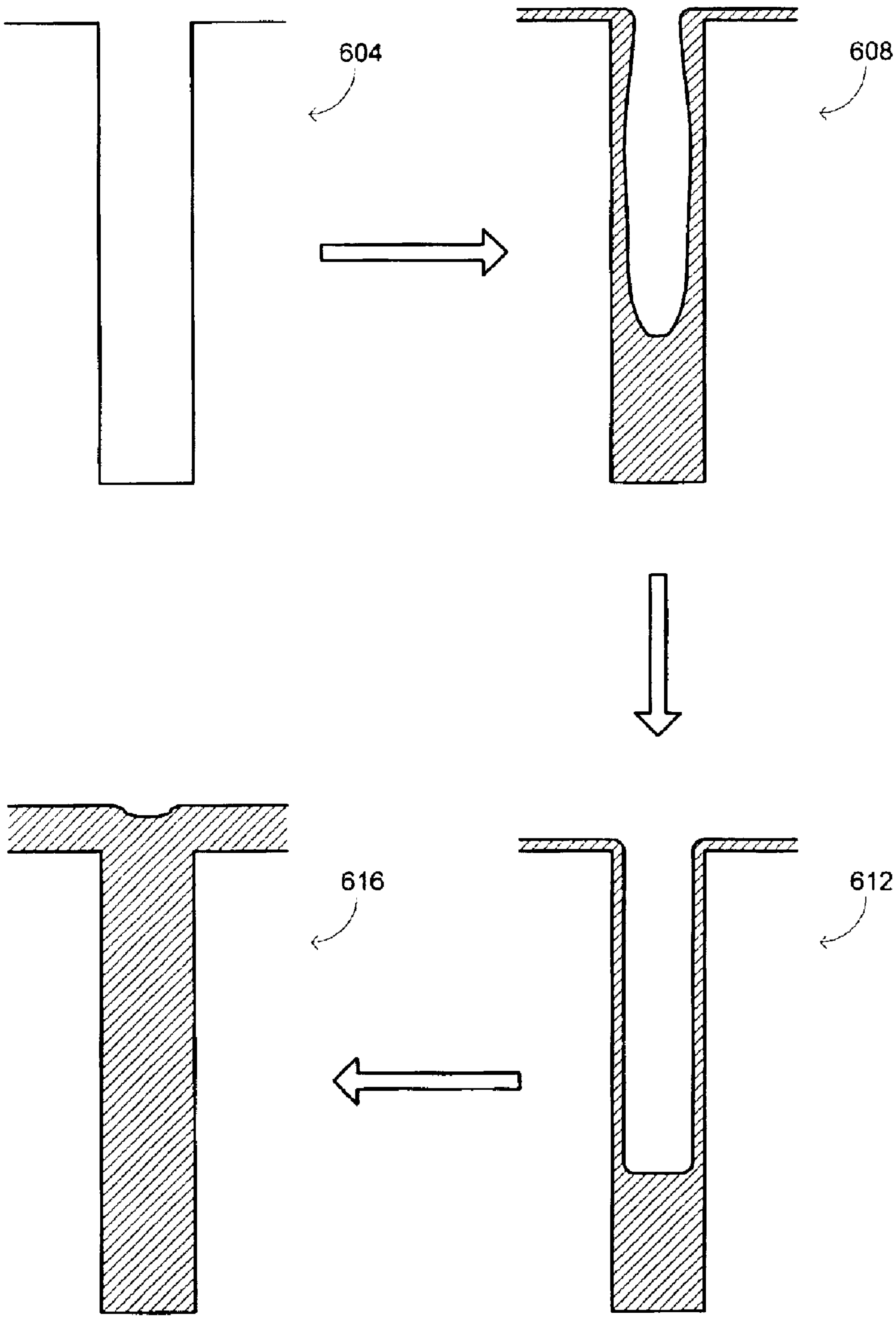
FIG. 6 provides schematic cross-sectional drawings illustrating how a high-aspect-ratio feature may be filled according to the embodiment illustrated in FIGS. 5A and 5B.

This integration is illustrated with the flow diagrams of FIGS. 5A and 5B and with the schematic cross-sectional diagrams of FIG. 6. The flow diagrams of FIGS. 5A and 5B show that process conditions for any of the deposition steps in the dep/etch/dep process may be chosen so that $RO^+$ ions dominate over $O_2^+$ ions. For example, in FIG. 5A, the first deposition uses a high-density plasma dominated by $RO^+$ ions at block 504. This may be achieved in the manner described above, using the silicon sources and oxidizing gas reactants previously identified. This first deposition is stopped before the gap closes, as shown in FIG. 6, where an initial gap 604 is partially filled with material to produce intermediate structure 608. The silicon oxide is then etched at block 508 to produce a structure 612 having a reshaped gap that is less severe. The etching may be performed physically, chemically, or with a multistep etching process that includes a first physical etch step and a subsequent chemical etch step, as described in copending, commonly assigned U.S. Pat. No. 6,802,944, entitled "HIGH DENSITY PLASMA CVD PROCESS FOR GAPFILL INTO HIGH ASPECT RATIO FEATURES," filed Oct. 23, 2002 by Farhan Ahmad et al., the entire disclosure of which is herein incorporated by reference for all purposes. The next deposition is then performed at block 512 to fill the gap to produce the filled structure denoted 616 in FIG. 6. This deposition 512 may proceed by an HDP-CVD process, including a process in which the plasma has $RO^+$ ions that dominate $O_2^+$ ions, but this is not a requirement, and alternative deposition techniques for this step are within the scope of the invention.

The process illustrated in FIG. 5B is similar, except that the $RO^+$-dominant HDP-CVD deposition is perform as the final deposition at block 528, preceded by an initial deposition at block 520 and an intermediate etching step at block 524. The initial deposition 520 may proceed by an HDP-CVD process, including a process in which the plasma has $RO^+$ ions that dominate $O_2^+$ ions, but this is not a requirement, and alternative deposition techniques for this step are within the scope of the invention. Like the embodiment described in connection with FIG. 5A, the etching step 524 may be performed physically, chemically, or with a multistep etching process that includes physical and chemical etch steps. Furthermore, while the processes shown in FIGS. 5A and 5B are illustrated for a pair of deposition steps separated by an etching step, the cycling of deposition and etching steps may be continued to provide a dep/etch/dep/etch/dep (or more extended) process with any one of the deposition steps comprising an $RO^+$-dominant HDP-CVD process. A determination of which deposition step(s) should comprise an $RO^+$-dominant HDP-CVD process may depend on the specific characteristics of the gap to be filled.

The gapfill characteristics may be further enhanced by using a light fluent gas such as $H_2$ during the $RO^+$-dominant deposition step to reduce the partial pressure of $O_2^+$ as described above. The fluent gas may be provided by a premixture with a heavier inert gas, such as Ar, to reduce cost and improve uniformity, or may be provided as a time-varying mixture of He and $H_2$. The use of such a time-varying He/$H_2$ mixture has particular advantages when used as part of an $RO^+$-dominant HDP-CVD deposition in a dep/etch/dep process. During that deposition step, the mixture is initially dominated by He, which provides a minimal level of redeposition to provide material that will protect structures during the subsequent etching step. Later in the deposition, the mixture is dominated by $H_2$, which helps to minimize any further redeposition and keep the gap open for improved overall gapfill. The variation may be performed continuously or in a stepwise fashion, including the circumstance where initially only He is flowed as a precursor gas and it is replaced by a flow of only $H_2$ later in the process. A further discussion of such a time variation of He and/or $H_2$ for the fluent gas is discussed further in Kapoor.

In some embodiments, the transition between the various deposition and etching steps, including any change in gas flows, chamber pressure, RF power levels, and other parameters, is done while a plasma is maintained in the chamber. In other embodiments, the plasma is extinguished between steps, gas flows and other parameters are adjusted in preparation for the next step, and a plasma is reformed. Embodiments in which the plasma is extinguished can be performed in situ either within a single chamber or in different chambers of a multichamber mainframe system, or performed ex situ in different chambers. In some embodiments, in situ processes are preferred for throughput and performance reasons.

Exemplary Substrate Processing System

Figure 7A:
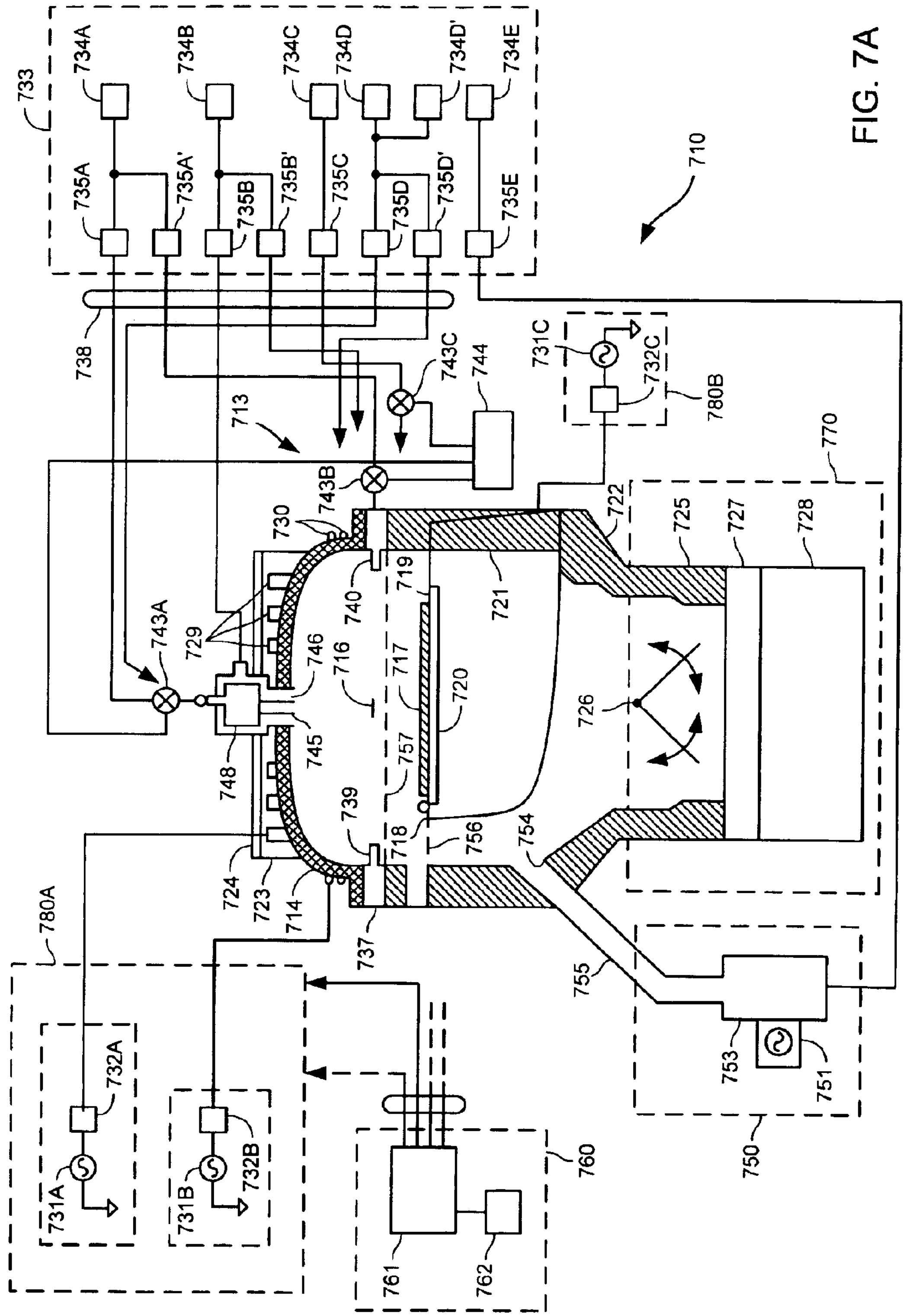
FIG. 7A is a simplified diagram of one embodiment of a high-density-plasma chemical-vapor deposition system according to the present invention.

The methods described above may be implemented with a variety of HDP-CVD systems, some of which are described in detail in connection with FIGS. 7A–7D. FIG. 7A schematically illustrates the structure of such an HDP-CVD system 710 in one embodiment. The system 710 includes a chamber 713, a vacuum system 770, a source plasma system 780A, a bias plasma system 780B, a gas delivery system 733, and a remote plasma cleaning system 750.

The upper portion of chamber 713 includes a dome 714, which is made of a ceramic dielectric material, such as aluminum oxide or aluminum nitride. Dome 714 defines an upper boundary of a plasma processing region 716. Plasma processing region 716 is bounded on the bottom by the upper surface of a substrate 717 and a substrate support member 718.

A heater plate 723 and a cold plate 724 surmount, and are thermally coupled to, dome 714. Heater plate 723 and cold plate 724 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 713 includes a body member 722, which joins the chamber to the vacuum system. A base portion 721 of substrate support member 718 is mounted on, and forms a continuous inner surface with, body member 722. Substrates are transferred into and out of chamber 713 by a robot blade (not shown) through an insertion/removal opening (not shown) in the side of chamber 713. Lift pins (not shown) are raised and then lowered under the control of a motor (also not shown) to move the substrate from the robot blade at an upper loading position 757 to a lower processing position 756 in which the substrate is placed on a substrate receiving portion 719 of substrate support member 718. Substrate receiving portion 719 includes an electrostatic chuck 720 that secures the substrate to substrate support member 718 during substrate processing. In a preferred embodiment, substrate support member 718 is made from an aluminum oxide or aluminum ceramic material.

Vacuum system 770 includes throttle body 725, which houses twin-blade throttle valve 726 and is attached to gate valve 727 and turbo-molecular pump 728. It should be noted that throttle body 725 offers minimum obstruction to gas flow, and allows symmetric pumping. Gate valve 727 can isolate pump 728 from throttle body 725, and can also control chamber pressure by restricting the exhaust flow capacity when throttle valve 726 is fully open. The arrangement of the throttle valve, gate valve, and turbo-molecular pump allow accurate and stable control of chamber pressures from between about 1 millitorr to about 2 torr.

The source plasma system 780A includes a top coil 729 and side coil 730, mounted on dome 714. A symmetrical ground shield (not shown) reduces electrical coupling between the coils. Top coil 729 is powered by top source RF (SRF) generator 731A, whereas side coil 730 is powered by side SRF generator 731B, allowing independent power levels and frequencies of operation for each coil. This dual coil system allows control of the radial ion density in chamber 713, thereby improving plasma uniformity. Side coil 730 and top coil 729 are typically inductively driven, which does not require a complimentary electrode. In a specific embodiment, the top source RF generator 731A provides up to 2,500 watts of RF power at nominally 2 MHz and the side source RF generator 731B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 780B includes a bias RF ("BRF") generator 731C and a bias matching network 732C. The bias plasma system 780B capacitively couples substrate portion 717 to body member 722, which act as complimentary electrodes. The bias plasma system 780B serves to enhance the transport of plasma species (e.g., ions) created by the source plasma system 780A to the surface of the substrate. In a specific embodiment, bias RF generator provides up to 5,000 watts of RF power at 13.56 MHz.

RF generators 731A and 731B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 732A and 732B match the output impedance of generators 731A and 731B with their respective coils 729 and 730. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 7B:
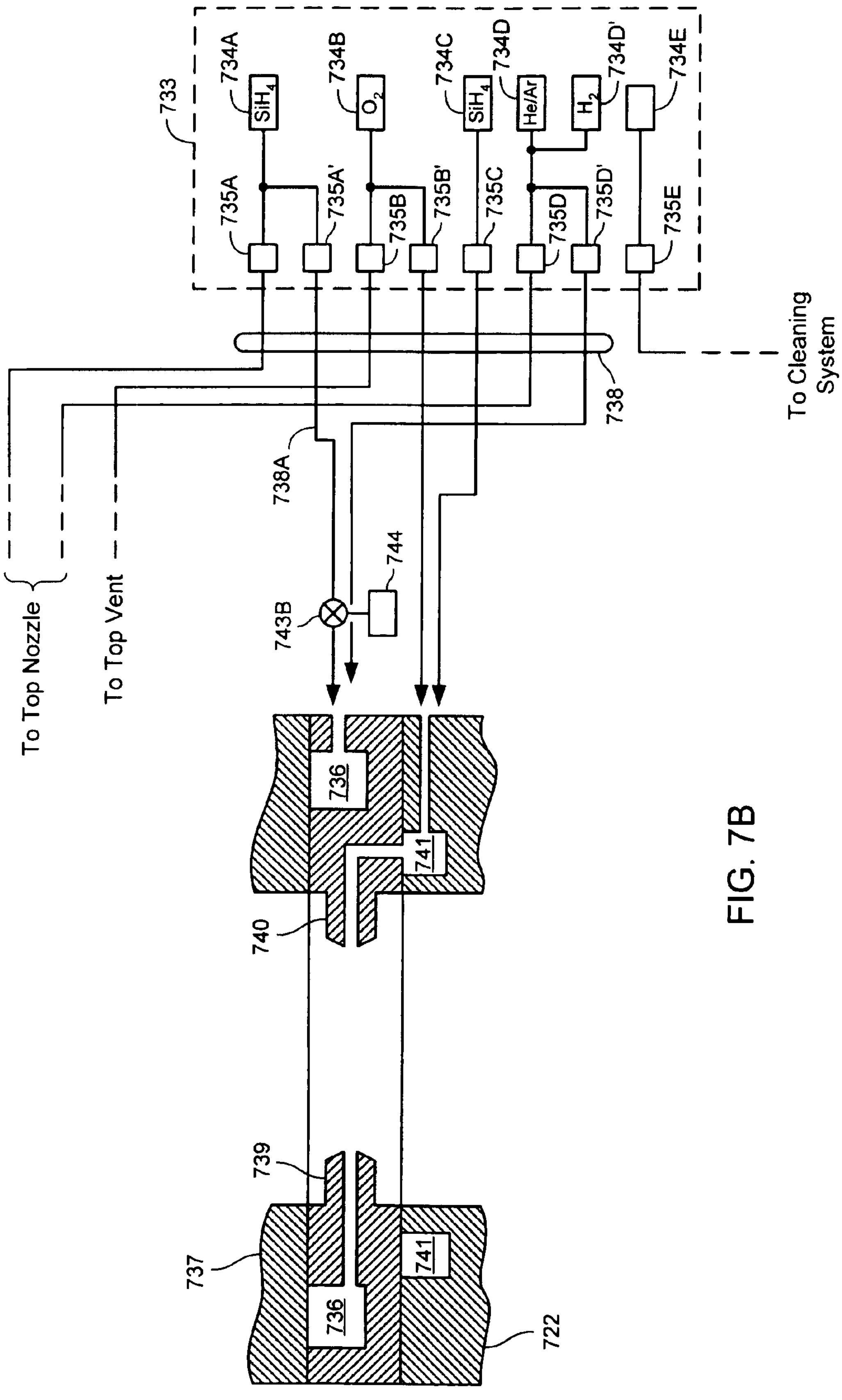
FIG. 7B is a simplified cross section of a gas ring that may be used in conjunction with the exemplary CVD processing chamber of FIG. 7A.

A gas delivery system 733 provides gases from several sources, 734A–734E chamber for processing the substrate via gas delivery lines 738 (only some of which are shown). As would be understood by a person of skill in the art, the actual sources used for sources 734A–734E and the actual connection of delivery lines 738 to chamber 713 varies depending on the deposition and cleaning processes executed within chamber 713. Gases are introduced into chamber 713 through a gas ring 737 and/or a top nozzle 745. FIG. 7B is a simplified, partial cross-sectional view of chamber 713 showing additional details of gas ring 737.

In one embodiment, first and second gas sources, 734A and 734B, and first and second gas flow controllers, 735A' and 735B', provide gas to ring plenum 736 in gas ring 737 via gas delivery lines 738 (only some of which are shown). Gas ring 737 has a plurality of source gas nozzles 739 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 737 has 12 source gas nozzles made from an aluminum oxide ceramic.

Gas ring 737 also has a plurality of oxidizer gas nozzles 740 (only one of which is shown), which in a preferred embodiment are co-planar with and shorter than source gas nozzles 739, and in one embodiment receive gas from body plenum 741. In some embodiments it is desirable not to mix source gases and oxidizer gases before injecting the gases into chamber 713. In other embodiments, oxidizer gas and source gas may be mixed prior to injecting the gases into chamber 713 by providing apertures (not shown) between body plenum 741 and gas ring plenum 736. In one embodiment, third, fourth, and fifth gas sources, 734C, 734D, and 734D', and third, fourth, and fifth gas flow controllers, 735C, 735D, and 735D', provide gas to body plenum via gas delivery lines 738. Additional valves, such as 743B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 743B, to isolate chamber 713 from delivery line 738A and to vent delivery line 738A to vacuum foreline 744, for example. As shown in FIG. 7A, other similar valves, such as 743A and 743C, may be incorporated on other gas delivery lines. Such three-way valves may be placed as close to chamber 713 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 7A, chamber 713 also has top nozzle 745 and top vent 746. Top nozzle 745 and top vent 746 allow independent control of top and side flows of the gases, which improves film uniformity and allows fine adjustment of the film's deposition and doping parameters. Top vent 746 is an annular opening around top nozzle 745. In one embodiment, first gas source 734A supplies source gas nozzles 739 and top nozzle 745. Source nozzle MFC 735A' controls the amount of gas delivered to source gas nozzles 739 and top nozzle MFC 735A controls the amount of gas delivered to top gas nozzle 745. Similarly, two MFCs 735B and 735B' may be used to control the flow of oxygen to both top vent 746 and oxidizer gas nozzles 740 from a single source of oxygen, such as source 734B. The gases supplied to top nozzle 745 and top vent 746 may be kept separate prior to flowing the gases into chamber 713, or the gases may be mixed in top plenum 748 before they flow into chamber 713. Separate sources of the same gas may be used to supply various portions of the chamber.

A remote microwave-generated plasma cleaning system 750 is provided to periodically clean deposition residues from chamber components. The cleaning system includes a remote microwave generator 751 that creates a plasma from a cleaning gas source 734E (e.g., molecular fluorine, nitrogen trifluoride, other fluorocarbons or equivalents) in reactor cavity 753. The reactive species resulting from this plasma are conveyed to chamber 713 through cleaning gas feed port 754 via applicator tube 755. The materials used to contain the cleaning plasma (e.g., cavity 753 and applicator tube 755) must be resistant to attack by the plasma. The distance between reactor cavity 753 and feed port 754 should be kept as short as practical, since the concentration of desirable plasma species may decline with distance from reactor cavity 753. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 720, do not need to be covered with a dummy wafer or otherwise protected, as may be required with an in situ plasma cleaning process. In one embodiment, this cleaning system is used to dissociate atoms of the etchant gas remotely, which are then supplied to the process chamber 713. In another embodiment, the etchant gas is provided directly to the process chamber 713. In still a further embodiment, multiple process chambers are used, with deposition and etching steps being performed in separate chambers.

System controller 760 controls the operation of system 710. In a preferred embodiment, controller 760 includes a memory 762, such as a hard disk drive, a floppy disk drive (not shown), and a card rack (not shown) coupled to a processor 761. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 731 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 765, and a light pen 766, as depicted in FIG. 7C.

Figure 7C:
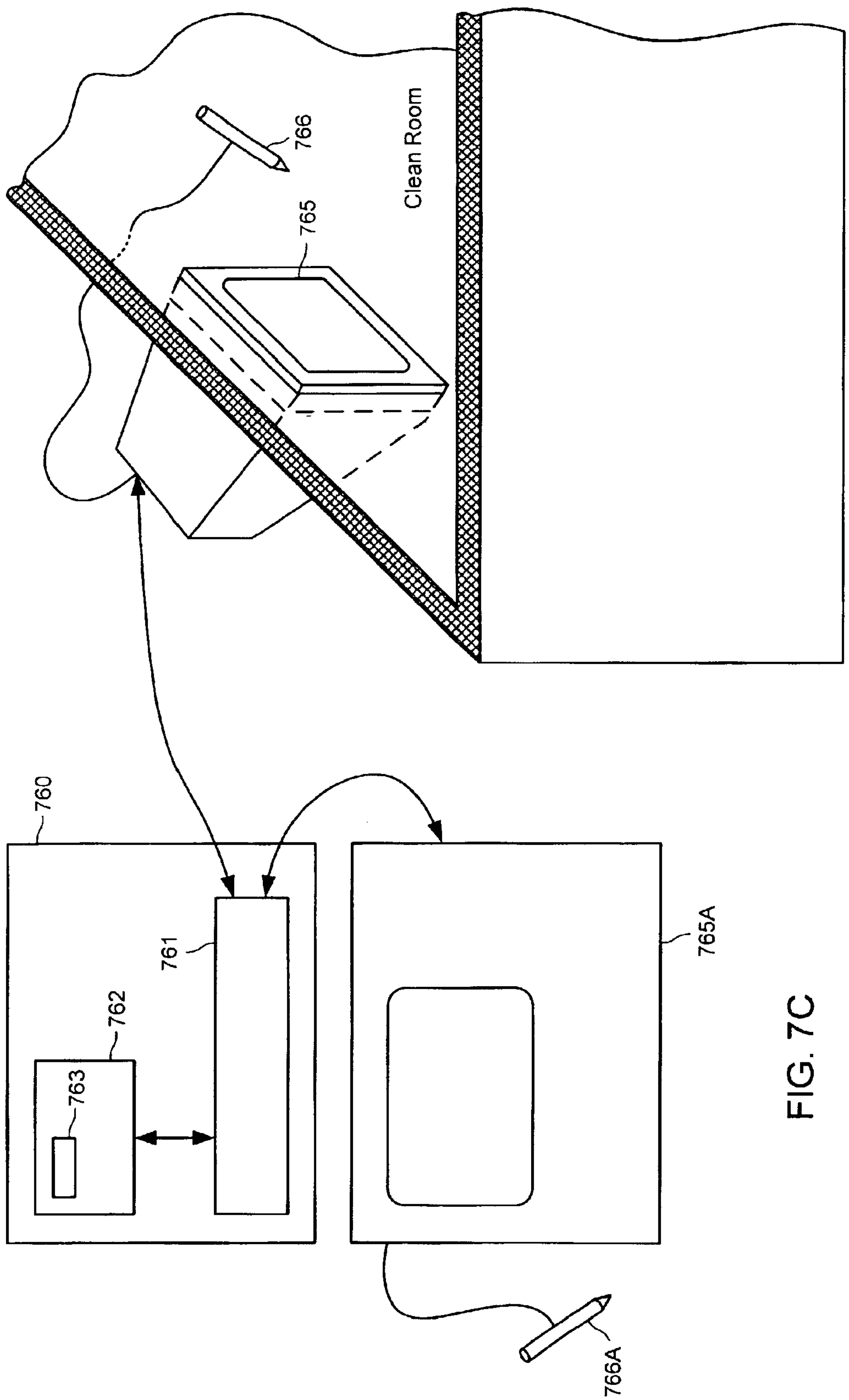
FIG. 7C is a simplified diagram of a monitor and light pen that may be used in conjunction with the exemplary CVD processing chamber of FIG. 7A.

FIG. 7C is an illustration of a portion of an exemplary system user interface used in conjunction with the exemplary CVD processing chamber of FIG. 7A. System controller 760 includes a processor 761 coupled to a computer-readable memory 762. Preferably, memory 762 may be a hard disk drive, but memory 762 may be other kinds of memory, such as ROM, PROM, and others.

System controller 760 operates under the control of a computer program 763 stored in a computer-readable format within memory 762. The computer program dictates the timing, temperatures, gas flows, RF power levels and other parameters of a particular process. The interface between a user and the system controller is via a CRT monitor 765 and a light pen 766, as depicted in FIG. 7C. In a preferred embodiment, two monitors, 765 and 765A, and two light pens, 766 and 766A, are used, one mounted in the clean room wall (665) for the operators and the other behind the wall (665A) for the service technicians. Both monitors simultaneously display the same information, but only one light pen (e.g. 766) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text/is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 7D:
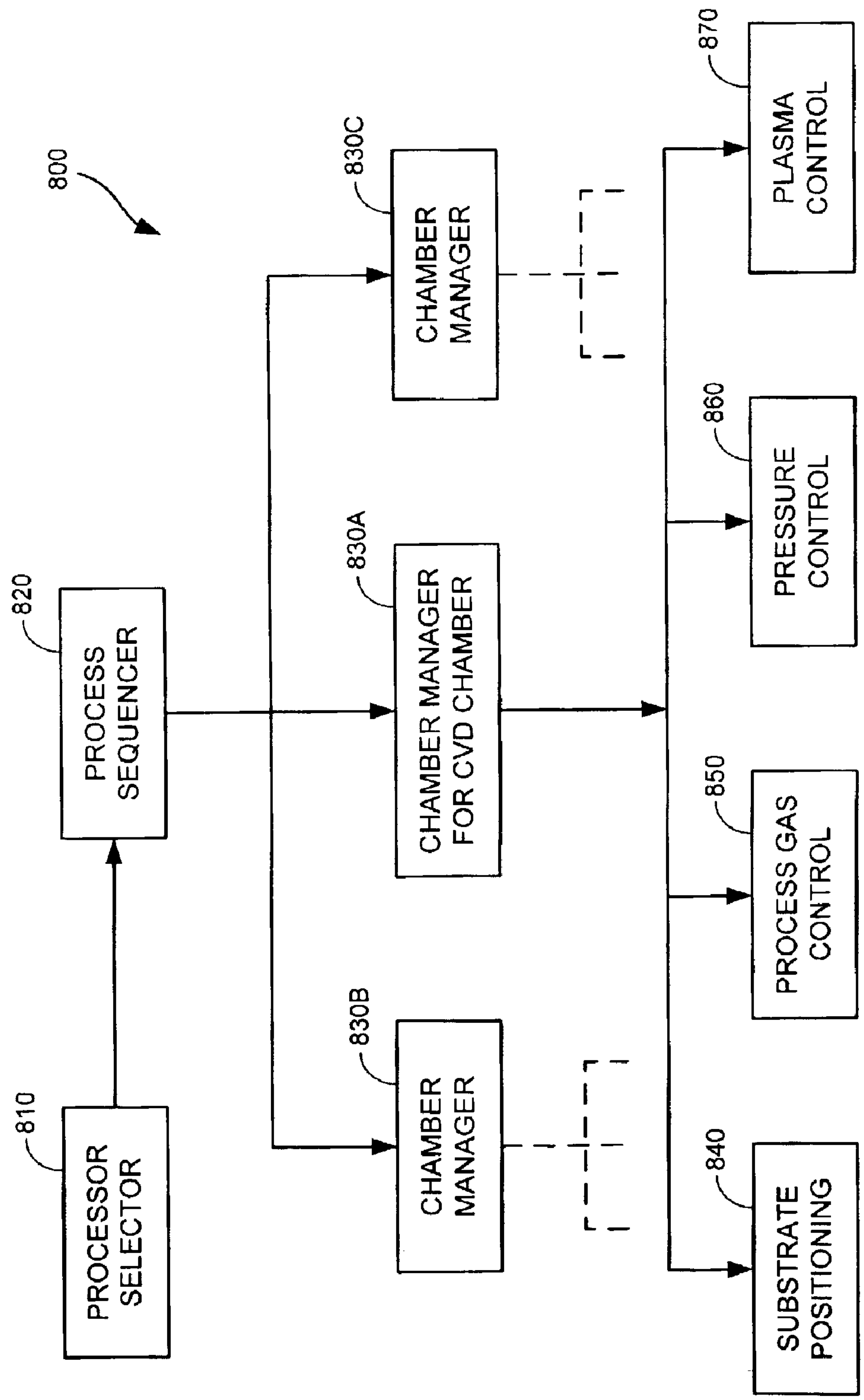
FIG. 7D is a flow chart of an exemplary process control computer program product used to control the exemplary CVD processing chamber of FIG. 7A.

FIG. 7D shows an illustrative block diagram of the hierarchical control structure of computer program 800. A user enters a process set number and process chamber number into a process selector subroutine 810 in response to menus or screens displayed on the CRT monitor by using the light pen interface. The process sets are predetermined sets of process parameters necessary to carry out specified processes, and are identified by predefined set numbers. Process selector subroutine 810 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 760, and the signals for controlling the process are output on the analog and digital output boards of system controller 760.

A process sequencer subroutine 820 comprises program code for accepting the identified process chamber and set of process parameters from the process selector subroutine 810 and for controlling operation of the various process chambers. Multiple users can enter process set numbers and process chamber numbers, or a single user can enter multiple process set numbers and process chamber numbers; sequencer subroutine 820 schedules the selected processes in the desired sequence. Preferably, sequencer subroutine 820 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 820 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 820 determines which process chamber and process set combination is going to be executed next, sequencer subroutine 820 initiates execution of the process set by passing the particular process set parameters to a chamber manager subroutine 830A–830C, which controls multiple processing tasks in chamber 713 and possibly other chambers (not shown) according to the process set sent by sequencer subroutine 820.

Examples of chamber component subroutines are substrate positioning subroutine 840, process gas control subroutine 850, pressure control subroutine 860, and plasma control subroutine 870. Those having ordinary skill in the art will recognize that other chamber control subroutines can be included depending on what processes are selected to be performed in chamber 713. In operation, chamber manager subroutine 830A selectively schedules or calls the process component subroutines in accordance with the particular process set being executed. Chamber manager subroutine 830A schedules process component subroutines in the same manner that sequencer subroutine 820 schedules the process chamber and process set to execute. Typically, chamber manager subroutine 830A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 7A and 7D. Substrate positioning subroutine 840 comprises program code for controlling chamber components that are used to load a substrate onto substrate support number 718. Substrate positioning subroutine 840 may also control transfer of a substrate into chamber 713 from, e.g., a plasma-enhanced CVD ("PECVD") reactor or other reactor in the multi-chamber system, after other processing has been completed.

Process gas control subroutine 850 has program code for controlling process gas composition and flow rates. Subroutine 850 controls the open/close position of the safety shut-off valves and also ramps up/ramps down the mass flow controllers to obtain the desired gas flow rates. All chamber component subroutines, including process gas control subroutine 850, are invoked by chamber manager subroutine 830A. Subroutine 850 receives process parameters from chamber manager subroutine 830A related to the desired gas flow rates.

Typically, process gas control subroutine 850 opens the gas supply lines, and repeatedly (i) reads the necessary mass flow controllers, (ii) compares the readings to the desired flow rates received from chamber manager subroutine 830A, and (iii) adjusts the flow rates of the gas supply lines as necessary. Furthermore, process gas control subroutine 850 may include steps for monitoring the gas flow rates for unsafe rates and for activating the safety shut-off valves when an unsafe condition is detected.

In some processes, an inert gas, such as argon, is flowed into chamber 713 to stabilize the pressure in the chamber before reactive process gases are introduced. For these processes, the process gas control subroutine 850 is programmed to include steps for flowing the inert gas into chamber 713 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 850 may include steps for bubbling a delivery gas such as helium through the liquid precursor in a bubbler assembly or for introducing the helium to a liquid injection valve. For this type of process, the process gas control subroutine 850 regulates the flow of the delivery gas, the pressure in the bubbler, and the bubbler temperature to obtain the desired process gas flow rates. As discussed above, the desired process gas flow rates are transferred to process gas control subroutine 850 as process parameters.

Furthermore, the process gas control subroutine 850 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 850 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 760 includes program code for controlling the pressure in chamber 713 by regulating the size of the opening of throttle valve 726 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 726 to a fixed position. Setting throttle valve 726 to a fixed position may eventually result in a steady-state pressure.

Alternatively, the chamber pressure may be measured, with a manometer for example, and the position of throttle valve 726 may be adjusted according to pressure control subroutine 860, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 860 is invoked, the desired, or target, pressure level is received as a parameter from chamber manager subroutine 830A. Pressure control subroutine 860 measures the pressure in chamber 713 by reading one or more conventional pressure manometers connected to the chamber; compares the measured value(s) to the target pressure; obtains proportional, integral, and differential (PID) values from a stored pressure table corresponding to the target pressure, and adjusts throttle valve 726 according to the PID values obtained from the pressure table. Alternatively, pressure control subroutine 860 may open or close throttle valve 726 to a particular opening size to regulate the pressure in chamber 713 to a desired pressure or pressure range.

Plasma control subroutine 870 comprises program code for controlling the frequency and power output setting of RF generators 731A and 731B and for tuning matching networks 732A and 732B. Plasma control subroutine 870, like the previously described chamber component subroutines, is invoked by chamber manager subroutine 830A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for depositing silicon oxide on a substrate disposed in a process chamber, the method comprising flowing a process gas comprising $H_2$, a silicon source, and an oxidizing gas reactant comprising hydrogen peroxide or $H_2O$ into the process chamber;

forming a plasma having an ion density of at least $10^{11}$ ions/$cm^3$ from the process gas; and depositing the silicon oxide within a gap in the substrate having an aspect ratio of at least 4:1 with the plasma using a process that has simultaneous deposition and sputtering components, wherein the plasma has a greater density of ions having a single oxygen atom than a density of ions having more than one oxygen atom.

2. The method recited in claim 1 wherein the ions having a single oxygen atom comprise hydroxyl radicals.

3. The method recited in claim 1 wherein the process gas further comprises an inert gas.

4. The method recited in claim 3 wherein the inert gas comprises He.

5. The method recited in claim 3 further comprising varying a relative flow of the $H_2$ and inert gas.

6. The method recited in claim 1 wherein the $H_2$ is flowed to the process chamber at a rate of at least 300 sccm.

7. The method recited in claim 1 wherein the substrate is kept at a temperature of at least 450° C. during deposition of the silicon oxide.

8. The method recited in claim 7 wherein the substrate is kept at a temperature between 500° C. and 700° C. during deposition of the silicon oxide.

9. The method recited in claim 1 further comprising:

etching the silicon oxide within the gap; and thereafter, depositing a remainder of the silicon oxide within the gap.

10. The method recited in claim 9 wherein the etching comprises an in situ chemical etching performed in the process chamber.

11. The method recited in claim 9 wherein depositing the remainder of the silicon oxide is performed with a plasma having an ion density of at least $10^{11}$ ions/$cm^3$ and a greater atomic-oxygen ion density than molecular-oxygen ion density.

* * * * *